United States Patent [19]

Kobayashi

[11] Patent Number: 5,894,445
[45] Date of Patent: Apr. 13, 1999

[54] SEMICONDUCTOR MEMORY DEVICE

[75] Inventor: Tatsuji Kobayashi, Tokyo, Japan

[73] Assignees: Mitsubishi Denki Kabushiki Kaisha; Mitsusubishi Electric Engineering Co., Ltd., both of Tokyo, Japan

[21] Appl. No.: 08/967,312

[22] Filed: Oct. 21, 1997

[30] Foreign Application Priority Data

May 6, 1997 [JP] Japan .................................. 9-115598

[51] Int. Cl.$^6$ ................................................ G11C 7/00
[52] U.S. Cl. ........................ 365/208; 365/201; 365/207
[58] Field of Search .................................. 365/201, 208, 365/189.05, 191, 207, 189.11

[56] References Cited

U.S. PATENT DOCUMENTS

| | | | |
|---|---|---|---|
| 5,258,958 | 11/1993 | Iwahashi et al. | 365/189.07 X |
| 5,339,273 | 8/1994 | Taguchi | 365/201 |
| 5,757,707 | 5/1998 | Abe | 365/208 X |
| 5,774,407 | 6/1998 | Kim | 365/208 X |

FOREIGN PATENT DOCUMENTS 3-137889 6/1991 Japan .
4-216400 8/1992 Japan .

*Primary Examiner*—Do Hyun Yoo

[57] ABSTRACT

A semiconductor memory device by the shared sense amplifier system, including: a sense amplifier; a plurality of bit line pairs; a plurality of word lines; a plurality of dynamic RAM cells, each of the RAM cells being connected to one bit line pair and one word line which is selected when data is read or written; switch circuit, provided for each of the plural bit line pairs, for connecting the corresponding bit line pair to said sense amplifier when the switch circuit is turned on and for disconnecting the corresponding bit line pair from said sense amplifier when the switch circuit is turned off; and bit line connection control circuit for, in order to read data from a predetermined RAM cell of the plural RAM cells in a test for detecting faults due to margin deficiency, turning on the switch circuit for the bit line pair connected to the RAM cell, and thereafter, before the word line connected to the RAM cell is selected, turning on the switch circuit for bit line pairs other than the bit line pair connected to the RAM cell, out of the plural bit line pairs.

6 Claims, 15 Drawing Sheets

Fig.2
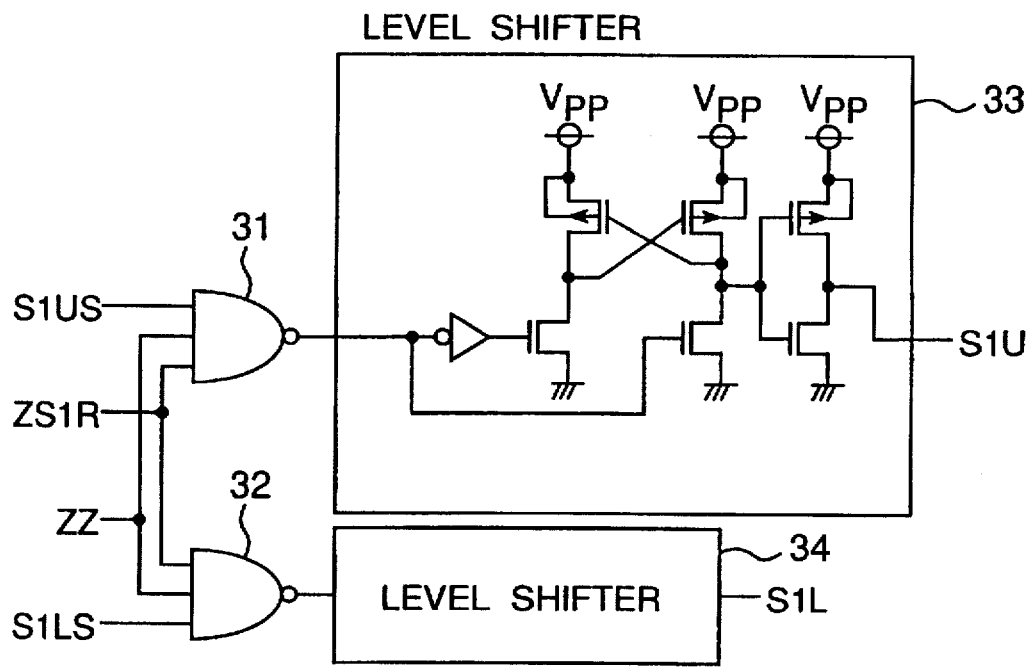
Fig.3A S1US
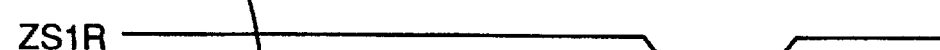
Fig.3B ZS1R
Fig.3C S1LS "L"
Fig.3D S1L $V_{PP}$
Fig.3E S1U $V_{PP}$ GND

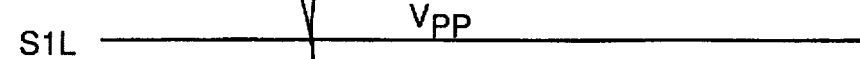
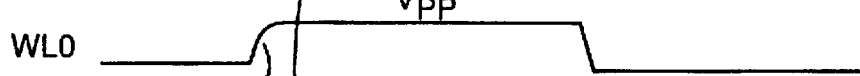
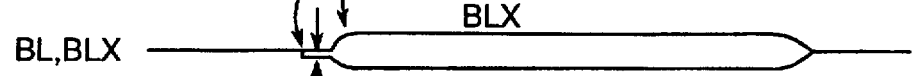
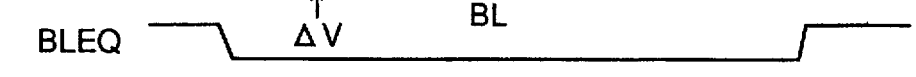
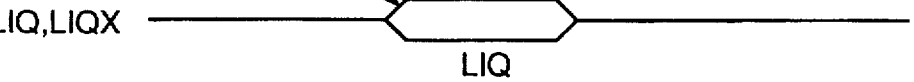

Fig.5A SOPX
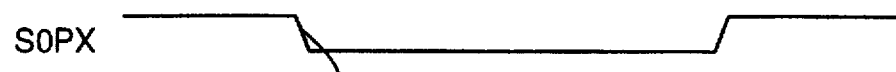
Fig.5B SON
Fig.5C S1L
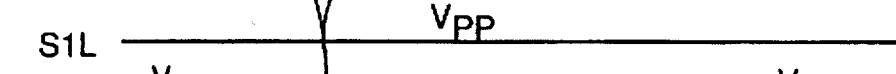
Fig.5D S1U
Fig.5E WL0
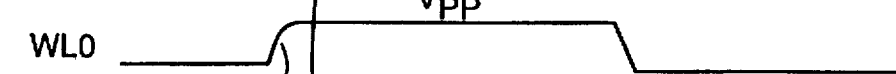
Fig.5F BL,BLX
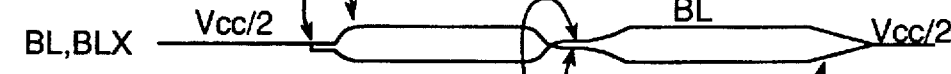
Fig.5G BLEQ
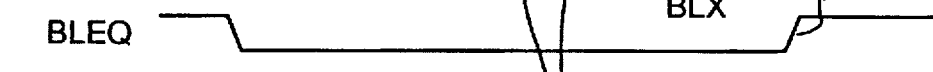
Fig.5H CSL
Fig.5I LIQ,LIQX
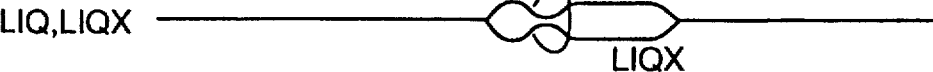

Fig.6
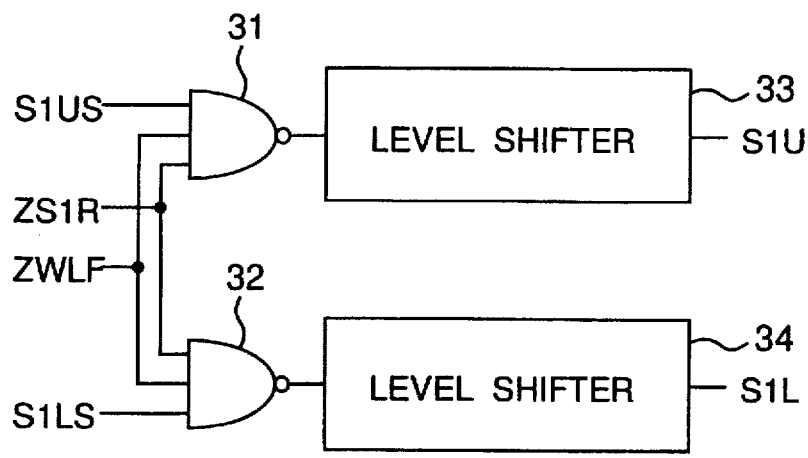
Fig.7A S1US
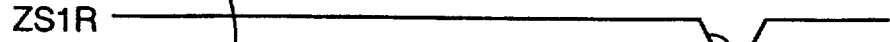
Fig.7B ZS1R
Fig.7C S1LS "L"
Fig.7D ZWLF
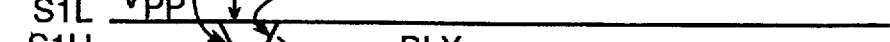
Fig.7E S1L S1U
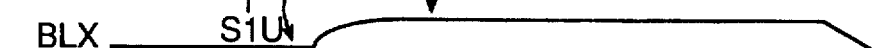
Fig.7F BLX BL
Fig.7G WL0
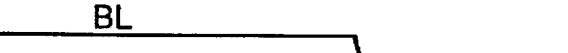

Fig.9
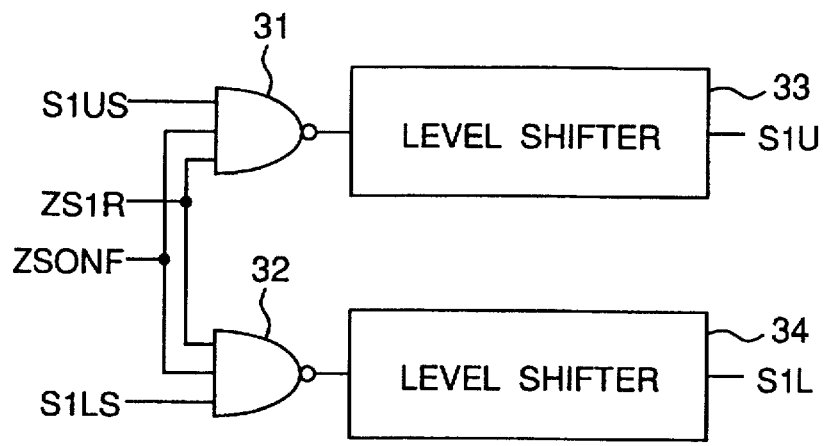
Fig.10A  S1US
Fig.10B  ZS1R
Fig.10C  S1LS  "L"
Fig.10D  ZSONF
Fig.10E  S1L
         S1U
Fig.10F  BLX
         BL
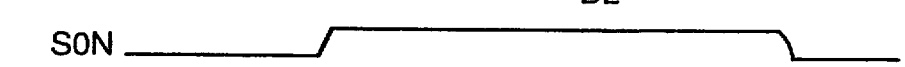
Fig.10G  SON
Fig.10H  SOPX Fig.13A S1US
Fig.13B ZS1R
Fig.13C S1LS "L"
Fig.13D ZCSL
Fig.13E S1L / S1U
Fig.13F BLX / BL
Fig.13G LIQX / LIQ
Fig.13H CSL Fig.16A S1US
Fig.16B ZS1R
Fig.16C S1LS "L"
Fig.16D ZWLR
Fig.16E S1L
       S1U
Fig.16F BLX
       BL
Fig.16G WL0

Fig.19A S1US
Fig.19B ZS1R
Fig.19C S1LS
Fig.19D ZBLEQF
Fig.19E S1L
        S1U
Fig.19F BLX
        BL
Fig.19G WL0
Fig.19H WL1

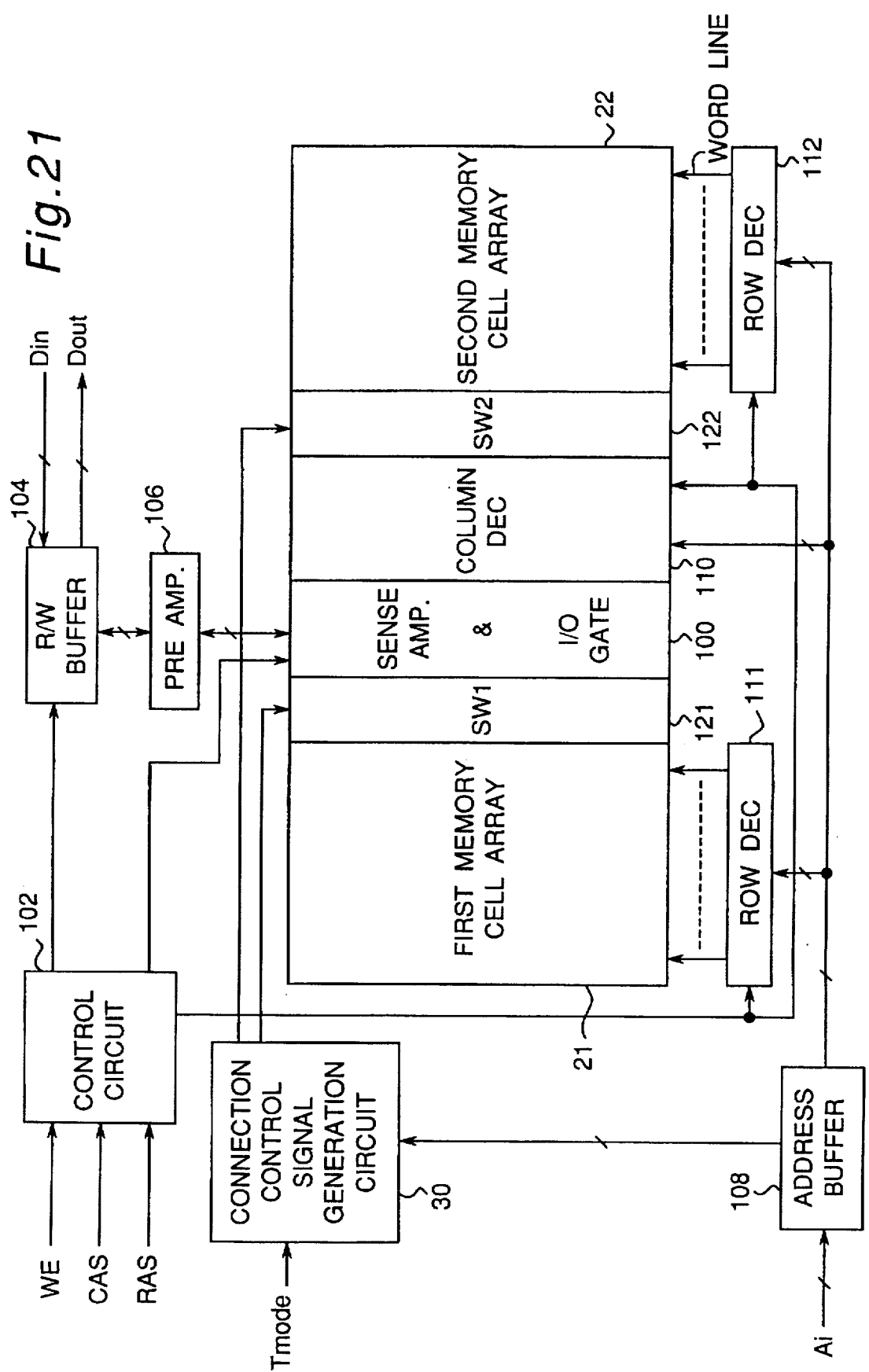

SEMICONDUCTOR MEMORY DEVICE

BACKGROUND OF THE INVENTION

The present invention relates to semiconductor memory device and, more specifically, to tests for detecting margin deficiencies in the capacity of capacitors or the like constituting each memory cell of a dynamic RAM (Random Access Memory) of the shared sense amplifier system.

There are some cases where the operating margin of some part within a dynamic RAM (DRAM) decreases due to abnormalities in the memory cell array or its peripheries of the DRAM, resulting in unstable operation such that the DRAM will not operate in compliance with specifications. Margin deficiencies that may cause faults of this kind include:

(1) deficiency memory cell storage capacitance (hereinafter, referred to as "cell capacitance margin deficiency");

(2) deficiency of sense amplifier sensitivity (hereinafter, referred to as "sense margin deficiency");

(3) deficiency of sense operation sensitivity due to a preamplifier of an intermediate buffer connected to local I/O lines i.e. signal lines for transmitting to another section (intermediate buffer) within the DRAM a data signal which is obtained after data is read from memory cells and the sense amplifier is activated (hereinafter, referred to as "local I/O sense margin deficiency");

(4) deficiency of the ability to reliably and correctly write data into memory cells (hereinafter, referred to as "write margin deficiency"); and (5) deficiency of the ability of precharge a bit line pair to Vcc/2 (where Vcc is the power supply voltage) before reading data from the memory cells or other operations (hereinafter, referred to as "equalize margin deficiency").

Faults due to such margin deficiencies as described above must be detected in tests. However, the tests for detecting such faults take a long time, while the number of bits in DRAMs has been increasing. As a result, there has been a demand for speeding up the tests for detecting faults due to margin deficiencies.

Under these circumstances, Japanese Patent Laid-Open Publications HEI 3-137889 and HEI 4-216400 have disclosed a margin evaluation method or a semiconductor memory which is enabled to evaluate the margin of storage capacitance of memory cells or to detect a cell capacitance margin deficiency by the bit line capacitance being increased in the test mode by connecting not only a bit line pair which would be connected in normal operation but also a bit line pair which would not be connected, to the sense amplifier, in a DRAM by the shared sense amplifier system which allows two or more bit line pairs to be connected to one sense amplifier. Such a method and equipment make it possible to speed up the tests for detecting faults due to cell capacitance margin deficiency. The Japanese Patent Laid-Open Publication HEI 4-216400 corresponds to the U.S. Pat. No. 5,339,273 incorporated herein by reference.

The margin evaluation method or the semiconductor memory disclosed in the above publications is indeed capable of detecting faults due to cell capacitance margin deficiency, but is incapable of detecting faults due to the margin deficiencies as described in (2) to (4) above. Also, in the semiconductor memory or test methods therefor disclosed in Japanese Patent Laid-Open Publication HEI 3-137889, a bit line pair which would not be connected in normal operation among a plurality of bit line pairs that can be connected to one sense amplifier is connected to the sense amplifier in the test mode after a word line from which data is to be read is selected. In this case, noise due to the connection of the bit line pair that would not be connected to the sense amplifier in normal operation would affect the test operation. As a result, when such a test has resulted in a decision of a fault, the cause of the fault can not be distinguished between a cell margin deficiency and a noise margin deficiency, which leads to a possibility that the cause of the fault can not be determined completely.

SUMMARY OF THE INVENTION

Therefore, an object of the present invention is to provide a semiconductor memory device such as a DRAM which can reduce the test time for detecting faults due to margin deficiencies and which can individually detect faults due to various kinds of margin deficiencies.

According to a first aspect of the invention we provide a semiconductor memory device by the shared sense amplifier system, comprising: a sense amplifier; a plurality of bit line pairs; a plurality of word lines; a plurality of dynamic RAM cells, each RAM cell being connected to one bit line pair and one word line which is selected when data is read or written; switch means, provided for each bit line pair, for connecting the corresponding bit line pair to the sense amplifier when the switch means is turned on and for disconnecting the corresponding bit line pair from the sense amplifier when the switch means is turned off; and bit line connection control means for, in operation of reading data from a predetermined RAM cell of the plural RAM cells in a test for detecting faults due to margin deficiency, turning on the switch means for the bit line pair connected to the RAM cell, and thereafter, before the word line connected to the RAM cell is selected, turning on the switch means for bit line pairs other than the bit line pair connected to the RAM cell, out of the plural bit line pairs.

With the above semiconductor memory device according to the first aspect of the invention, faults due to cell capacitance margin deficiency can be detected by a simple test. Thus, the test time for detecting faults due to margin deficiencies can be reduced.

According to a second aspect of the invention we provide a semiconductor memory device by the shared sense amplifier system, comprising: a sense amplifier; a plurality of bit line pairs; a plurality of word lines; a plurality of dynamic RAM cells, each the RAM cell being connected to one bit line pair and one word line which is selected when data is read or written; switch means, provided for each bit line pair, for connecting the corresponding bit line pair to the sense amplifier when the switch means is turned on and for disconnecting the corresponding bit line pair from the sense amplifier when the switch means is turned off; and bit line connection control means for, in operation of reading data from a predetermined RAM cell of the plural RAM cells in a test for detecting faults due to margin deficiency, turning on the switch means for the bit line pair connected to the RAM cell, and thereafter, immediately after operation of the sense amplifier is started, turning on the switch means for bit line pairs other than the bit line pair connected to the RAM cell, out of the plural bit line pairs.

With the above semiconductor memory device according to the second aspect of the invention, faults due to sense margin deficiency can be detected by a simple test. Thus, the test time for detecting faults due to margin deficiencies can be reduced.

According to a third aspect of the invention we provide a semiconductor memory device by the shared sense amplifier system, comprising: a sense amplifier; a plurality of bit line pairs; a plurality of word lines; a plurality of dynamic RAM cells, each RAM cell being connected to one bit line pair and one word line which is selected when data is read or written; switch means, provided for each bit line pair, for connecting the corresponding bit line pair to the sense amplifier when the switch means is turned on and for disconnecting the corresponding bit line pair from said sense amplifier when the switch means is turned off; a local I/O line for transferring to an independently provided intermediate buffer a signal obtained through operation of the sense amplifier on a signal of data read from one of the plural RAM cells; I/O line connection control means for controlling connection between the local I/O line and the sense amplifier; and bit line connection control means for, in operation of reading data from a predetermined RAM cell of the plural RAM cells in a test for detecting faults due to margin deficiency, turning on the switch means for the bit line pair connected to the RAM cell, and, immediately after the local I/O line is connected to the sense amplifier by the I/O line connection control means to transfer the read data to the intermediate buffer, turning on the switch means for bit line pairs other than the bit line pair connected to the RAM cell, out of the plural bit line.

With the above semiconductor memory device according to the third aspect of the invention, faults due to local I/O sense margin deficiency can be detected by a simple test. Thus, the test time for detecting faults due to margin deficiencies can be reduced.

According to a fourth aspect of the invention we provide a semiconductor memory device by the shared sense amplifier system, comprising: a sense amplifier; a plurality of bit line pairs; a plurality of word lines; a plurality of dynamic RAM cells, each RAM cell being connected to one bit line pair and one word line which is selected when data is read or written; switch means, provided for each bit line pair, for connecting the corresponding bit line pair to the sense amplifier when the switch means is turned on and for disconnecting the corresponding bit line pair from the sense amplifier when the switch means is turned off; and bit line connection control means for, in operation of writing data into a predetermined RAM cell of the plural RAM cells in a test for detecting faults due to margin deficiency, turning on the switch means for the bit line pair connected to the RAM cell, and after the word line connected to the RAM cell has been kept selected for a predetermined period and before the word line goes to a non-selected state, turning on the switch means for bit line pairs other than the bit line pair connected to the RAM cell, out of the plural bit line pairs.

With the above semiconductor memory device according to the fourth aspect of the invention, faults due to write margin deficiency can be detected by a simple test. Thus, the test time for detecting faults due to margin deficiencies can be reduced.

According to a fifth aspect of the invention we provide a semiconductor memory device by the shared sense amplifier system, comprising: a sense amplifier; a plurality of bit line pairs; a plurality of word lines; a plurality of dynamic RAM cells, each RAM cell being connected to one bit line pair and one word line which is selected when data is read or written; switch means, provided for each bit line pair, for connecting the corresponding bit line pair to the sense amplifier when the switch means is turned on and for disconnecting the corresponding bit line pair from the sense amplifier when the switch means is turned off; equalize means for, before the word line connected to a RAM cell from which data is to be read is selected, precharging the bit line pair connected to the RAM cell to a voltage equal to ½ of power supply voltage Vcc; and bit line connection control means for, in operation of reading data from a predetermined RAM cell of the plural RAM cells in a test for detecting faults due to margin deficiency, turning on the switch means for the bit line pair connected to the RAM cell, and, after the word line connected to the RAM cell is selected and operation of the sense amplifier is started, and a predetermined period before the operation of the sense amplifier is halted, turning on the switch means for bit line pairs other than the bit line pair connected to the RAM cell, out of the plural bit line pairs.

With the above semiconductor memory device according to the fifth aspect of the invention, faults due to equalize margin deficiency can be detected by a simple test. Thus, the test time for detecting faults due to margin deficiencies can be reduced.

Furthermore, with the above-mentioned semiconductor memory devices according to the first through fifth aspect of the invention, since faults due to various margin deficiencies can be detected individually, information useful for investigating the causes of faults can be acquired. Then, by detecting such faults due to various margin deficiencies, faulty chips can be easily prevented from being shipped to customers.

Other features and advantages of the present invention will become apparent from the following description of the invention which refers to the accompanying drawings.

BRIEF DESCRIPTION OF THE DRAWINGS

FIG. 2 is a circuit diagram showing the construction of a connection control signal generation circuit in the preferred embodiment of the invention;

FIGS. 3A–3E are signal waveform diagrams showing the operation in normal mode of the connection control signal generation circuit in the preferred embodiment of the invention;

FIGS. 4A–4I are signal waveform diagrams showing read operation in normal mode of the DRAM of Preferred Embodiment 1;

FIGS. 5A–5I are signal waveform diagrams showing write operation in normal mode of the DRAM of Preferred Embodiment 1;

FIG. 6 is a circuit diagram showing the construction of the connection control signal generation circuit in Preferred Embodiment 1;

FIGS. 7A–7G are signal waveform diagrams showing test operation for detecting faults due to cell capacitance margin deficiency in Preferred Embodiment 1;

FIG. 9 is a circuit diagram showing the construction of a connection control signal generation circuit in Preferred Embodiment 2;

FIGS. 10A–10H are signal waveform diagrams showing test operation for detecting faults due to sense margin deficiency in Preferred Embodiment 2;

FIGS. 13A–13H are signal waveform diagrams showing test operation for detecting faults due to local I/O sense margin deficiency in Preferred Embodiment 3;

FIGS. 16A–16G are signal waveform diagrams showing test operation for detecting faults due to write margin deficiency in Preferred Embodiment 4;

FIG. 19A–19H are signal waveform diagrams showing test operation for detecting faults due to equalize margin deficiency in Preferred Embodiment 5;

FIG. 21 is a system diagram showing the general construction of a DRAM which is a preferred embodiment of the present invention.

DETAILED DESCRIPTION OF THE PREFERRED EMBODIMENTS

Figure 1:
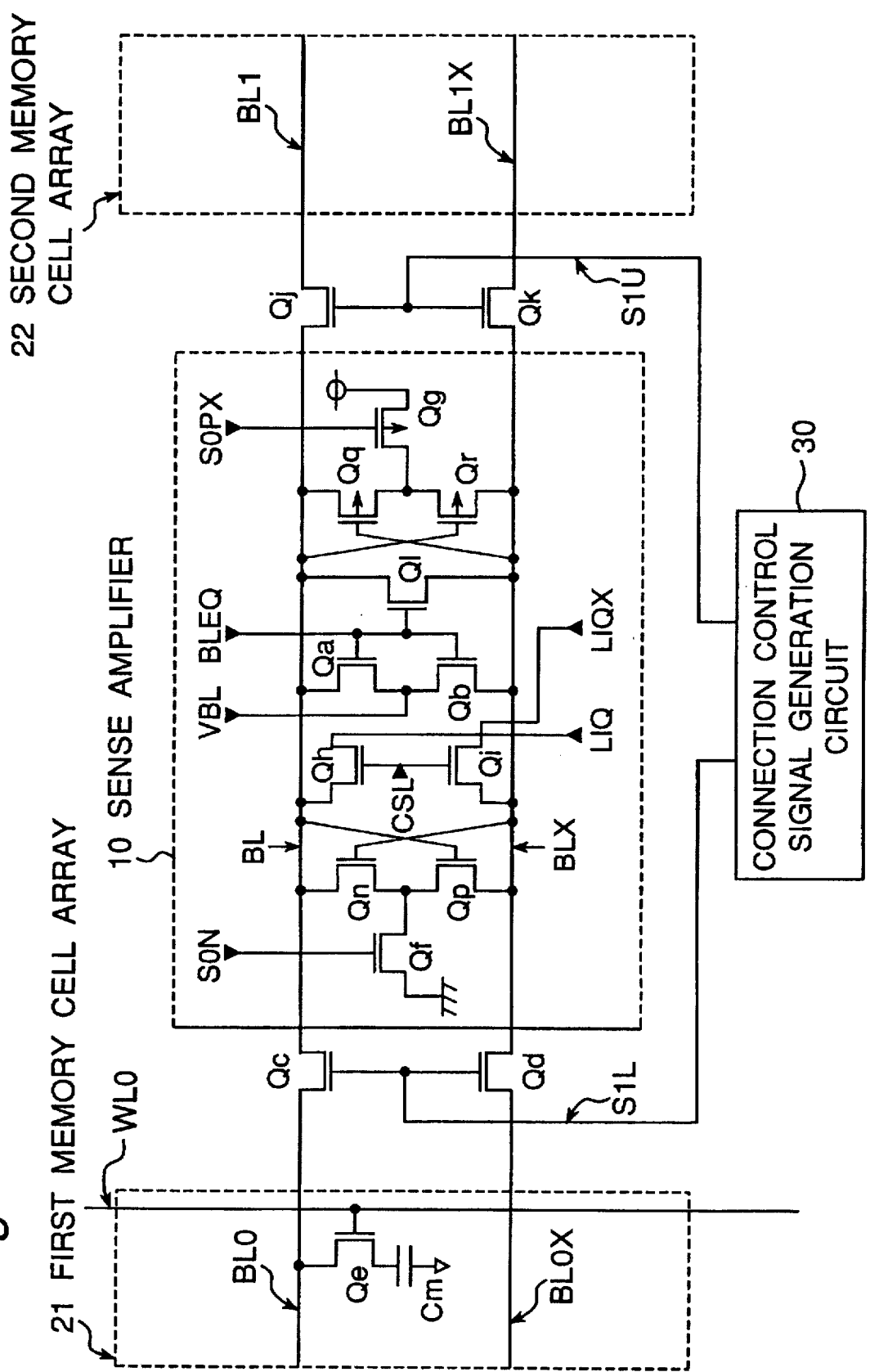
FIG. 1 is a circuit diagram showing the construction of main part of a DRAM which is a preferred embodiment of the present invention.

Hereinbelow, Preferred Embodiments 1 to 5 of the present invention are described with reference to the accompanying drawings. First, construction and operation features common to the preferred embodiments are described.

<0.1 Construction>

FIG. 21 is a system block diagram showing the general construction of a DRAM which is a preferred embodiment of the present invention. The DRAM is embodied as a MOS semiconductor memory device by the shared sense amplifier system, where a memory cell array is divided into two, namely a first memory cell array 21 and a second memory cell array 22. Between the two memory cell arrays 21 and 22 are provided a block 100 comprising sense amplifiers and I/O gates, switch blocks 121 and 122, and a column decoder 110. Each sense amplifier in the block 100 is connected to the first memory cell array 21 via each switch in the switch block 121 and to the second memory cell array 22 via each switch in the switch block 122. The DRAM also includes a connection control signal generation circuit 30 for generating signals which control turn-ON and turn-OFF of each switch in the switch blocks 121 and 122. The generated signal depends on whether or not the DRAM is in the test. Furthermore, the DRAM includes an address buffer 108, row decoders 111 and 112, a control circuit 102, read/write data buffer 104, and preamplifier 106, as an ordinary DRAM. The control circuit 102 generates signals which control a read/write operation and signals which control operation of the sense amplifiers in the block 100 based on a write enable signal WE, a column address strobe signal CAS, and a row address strobe signal RAS. The preamplifier 106 amplifies a signal of data which is read from the first or second memory cell array 21, 22 via a sense amplifier in the block 100, and acts as a intermediate buffer between the a read/write data buffer 104 and the block 100 comprising sense amplifiers and I/O gates.

FIG. 1 is a circuit diagram showing the construction of the main part of the above-mentioned DRAM. The main part of the DRAM includes a sense amplifier 10, a pair of transistors Qc and Qd, a pair of transistors Qj and Qk, the first and second cell arrays 21, 22 and the connection control signal generation circuit 30. The sense amplifier 10, the pair of transistors Qc and Qd, the pair of transistors Qj and Qk shown in FIG. 1 correspond to a sense amplifier in the block 100, a switch in the switch block 121, a switch in the switch block 122 shown in FIG. 21, respectively.

The DRAM is embodied as a MOS semiconductor device by the shared sense amplifier system, where the DRAM allows two bit line pairs to be connected to one sense amplifier. More specifically, as shown in FIG. 1, to the sense amplifier 10, a first bit line pair BL0, BL0X in the first cell array 21 are connected via the transistors Qc, Qd serving as switch means, respectively, while a second bit line pair BL1, BLLX in the second cell array 22 are also connected via the transistors Qj, Qk serving as switch means, respectively. The connection control signal generation circuit 30 generates a first control signal SIL for controlling the connection between the sense amplifier 10 and the first bit line pair BL0, BL0X, and a second control signal S1U for controlling the connection between the sense amplifier 10 and the second bit line pair BLi, BL1X, where the first control signal SIL is applied to the gate of the transistors Qc and Qd while the second control signal S1U is applied to the gate of the transistors Qj and Qk.

The sense amplifier 10 comprises: a voltage difference enlarging circuit which comprises N-channel transistors Qf, Qn, Qp and P-channel transistors Qg, Qq, Qr, and which enlarges a voltage difference between a bit line pair BL, BLX within the sense amplifier 10 (hereinafter, the bit line pair BL, BLX will be referred to as "intra-amplifier bit line pair") based on sense amplifier activating signals S0N, S0PX so that one bit line goes "L" and the other bit line "H"; an equalizer circuit which comprises N-channel transistors Qa, Qb, Ql and which precharges the intra-amplifier bit line pair BL, BLX to Vcc/2 based on a bit line equalize signal and a bit line precharging power supply VBL; and a local I/O connection control circuit which comprises N-channel transistors Qh, Qi and which controls the connection between bit lines BL, BLX and local I/O lines LIQ, LIQX based on an I/O connection signal CSL.

The connection control signal generation circuit 30 is constructed by using NAND gates 31, 32 and level shifters 33, 34, as shown in FIG. 2, where inputs to the connection control signal generation circuit 30 are signals S1LS, S1US that specify the timings at which the first and second bit line pairs BL0, BL0X, BL1, BL1X are connected to the sense amplifier 10, respectively, and a bit line select reset signal ZS1R for connecting the two bit line pairs BL0, BL0X, BL1, BL1X to the sense amplifier for a return to the initial state after the completion of read or write operation, and besides a control signal ZZ for test operation (hereinafter, referred to as "test control signal"). The first control signal S1L will be held at "High" level (hereinafter, abbreviated as "H") of voltage Vpp only during the period while at least one of the signals S1LS, ZS1R and ZZ remains at "Low" level (hereinafter, abbreviated as "L"), and the second control signal S1U will be held at "H" of voltage Vpp only during the period while at least one of the signals S1US, ZS1R and ZZ remains at "L". When the control signals S1L, S1U are "H", the voltage is leveled to Vpp by the level shifter, where Vpp is set so as to be a voltage higher than Vcc by about a double of a threshold voltage Vth of the N-channel transistors. As a result, when the control signals S1L, S1U are "H", N-channel transistors to the gate of which these signals are applied will securely turn ON.

<0.2 Normal Operation>

Normal operation of the DRAM having the above construction is similar to that of the conventional DRAM by the shared sense amplifier system. First described below is normal operation of the DRAM having the above construction.

<0.2.1 Read Operation>

FIG. 4 is a signal waveform diagram showing the read operation of the DRAM. Now assuming that data is read from a cell comprising a transistor Qe and a capacitor Cm (hereinafter, referred to as "target cell") in the first cell array 21, the individual sections as shown in FIG. 1 will then operate as follows:

(1) A bit line equalize signal BLEQ is first "H" (FIG. 4G). By the transistors Qa, Qb, Ql turning ON, the bit line precharging power supply VBL, the voltage of which is Vcc/2, is connected to the intra-amplifier bit line pair BL, BLX (FIG. 4F). At this time point, because both first and second control signals S1L, S1U are at Vpp level ("H"), both first and second bit line pairs BL0, BL0X, BL1, BL1X have been connected to the intra-amplifier bit line pair BL, BLX. Accordingly, as the bit line equalize signal BLEQ goes "H" as described above, the first and second bit line pairs BL0, BL0X, BL1, BL1X as well as the intra-amplifier bit line pair BL, BLX as well as are precharged to the voltage of Vcc/2.

(2) As the bit line equalize signal BLEQ goes "L" (FIG. 4G) so that the transistors Qa, Qb, Ql turn OFF, the bit line pairs BL, BLX, BL0, BL0X, BL1, BL1X go floating.

(3) As the second control signal S1U goes "L" (FIG. 4D) so that the transistors Qj, Qk turn OFF, the second bit line pair BL1, BL1X are disconnected from the sense amplifier 10.

(4) As the word line WL0 connected to the gate of the transistor Qe of the target cell is selected so that its voltage becomes Vpp (FIG. 4E), the transistor Qe of the target cell turns ON, causing a signal representing data of the target cell to be outputted to the first bit line pair BL0, BL0X (the following description will be based on the assumption that data "L" has been stored in the target cell).

(5) As the sense amplifier activating signal S0N goes "H" (FIG. 4B), the transistor Qf turns ON. In comparison of voltage between the bit lines BL and BLX at this time point, the voltage of BLX is higher (FIG. 4F), so that the transistor Qn turns ON, causing the bit line BL to go "L". Also, nearly at the same time point, the sense amplifier activating signal S0PX goes "L" (FIG. 4A) so that the transistor Qg turns ON. At this time point, because the voltage of the bit line BL is lower than the voltage of the bit line BLX (FIG. 4F), the transistor Qr turns ON, causing the bit line BLX to go "H".

(6) As the I/O connection signal CSL goes "H" (FIG. 4H) so that the transistors Qh, Qi turn ON, the bit line BL is connected to the local I/O line LIO while the bit line BLX is connected to the local I/O line LIOX. As a result, data "L" read from the target cell is outputted to the local I/O line (FIG. 4I).

<0.2.2 Write Operation>

FIG. 5 is a signal waveform diagram showing write operation of the DRAM. Now assuming that data "H" is written into the target cell (the cell comprising the transistor Qe and the capacitor Cm) that has held the data "L" in the first cell array 21, then the individual sections as shown in FIG. 1 will operate as follows:

(1) Operations similar to those of the steps (1)→(2)→(3)→(4) in the above read operation are performed (see FIGS. 5G→5F→5D→5E). As a result, a signal representing data "L" that has been held in the target cell is outputted to the first bit line pair BL0, BL0X.

(2) After the local I/O lines LIO and LIOX are driven "H" and "L", respectively, by a write buffer (FIG. 5I), the I/O connection signal CSL goes "H" (FIG. 5H) so that the transistors Qh, Qi turn ON, whereby the local I/O lines LIO and LIOX are connected to the bit lines BL and BLX, respectively. As a result, data "H" is transferred through the local I/O line LIO to the intra-amplifier bit line BL, where because the intra-amplifier bit line BL is connected to the first bit line BL0 (first control signal S1L="H"), the capacitor Cm in the target cell is charged so that the data of the target cell is rewritten from "L" to "H".

(3) The word line WL0 goes "L" (non-selected) so that the transistor Qe of the target cell turns OFF, and data "H" is held in the target cell.

<0.2.3 Connection Control of Bit Line Pairs>

The test control signal ZZ to be inputted to the connection control signal generation circuit 30 shown in FIG. 2 is "H" in normal operation, and the first and second control signals S1L, S1U that control the connection between the sense amplifier 10 and the first and second bit line pairs BL0, BL0X, BL1, BL1X will change in the same way as in the prior art, and change in the read and write operations as shown in FIG. 3 (the first control signal S1L in FIG. 3 is the control signal on the target cell side). That is, the changes are as follows:

(1) The input signal S1LS to the connection control signal generation circuit 30 is kept "L" at all times, and the first control signal S1L is kept at Vpp level at all times.

(2) Because the signals S1US and ZS1R, which are input signals to the connection control signal generation circuit 30, are "L" and "H", respectively, in the initial state, the second control signal S1U is at Vpp level in the initial state. Thereafter, the signal S1US goes "H" so that the second control signal S1U goes to ground level ("L"), and further thereafter the signal ZS1R goes "L" so that the second control signal S1U goes to Vpp level.

With the first and second control signals S1L, S1U as described above, in the normal operation (normal read and write operations), out of the two bit line pairs that are connectable to the sense amplifier 10, only the bit line pair BL0, BL0X connected to the target cell are connected to the sense amplifier 10 during the period while data read and write operations are performed with the target cell. Therefore, the capacitance of bit line pairs, as viewed from the sense amplifier 10, is given substantially only by the capacitance of one bit line pair. This causes the amount of input signals for the sense amplifier to be large, which is advantageous during normal operation.

The normal operation as described above is similar to that of the conventional DRAM, and the preferred embodiments of the present invention feature in the operations in the test mode in which a test for detecting faults due to various types of margin deficiencies of the DRAM chip is performed. That is, as shown in FIG. 2, in the preferred embodiments of the present invention, the test control signal ZZ is added as an input signal to the connection control signal generation circuit 30, as compared with the prior art. This test control signal ZZ is "H" in normal operation but is held "L" for a specified period in the test mode. As a result, the transistors Qj, Qk as shown in FIG. 1 will hold ON for the specified period, so that the second bit line pair (a bit line pair that conventionally would not be connected for the period in which data read and write are performed) BL1, BL1X are connected to the sense amplifier 10. In this case, the timing at which the test control signal ZZ goes "L" differs among the individual preferred embodiments.

Now construction and operation features unique to the individual preferred embodiments of the invention are described below.

Preferred Embodiment 1

FIG. 6 is a diagram showing the construction of the connection control signal generation circuit 30 in a DRAM which is Preferred Embodiment 1 of the invention. In this preferred embodiment, a test control signal ZWLF (corresponding to the test control signal ZZ as described above) is added as an input to the connection control signal generation circuit 30, which makes it possible to perform a test for detecting faults due to cell capacitance margin deficiency.

FIG. 7 is a signal waveform diagram showing operation of the test in this preferred embodiment. In this test operation, data that has been held in a predetermined cell is read. Assuming that the cell in this case is referred to as a "target cell" and assumed to comprise a transistor Qe and a capacitor Cm, as in the description of normal operation as described before, the test operation in this preferred embodiment is described below with reference to FIGS. 6 and 7 as well as FIG. 1.

In the process of reading data from the target cell in the normal operation as described before (hereinafter, the operational state of the DRAM in which the normal operation is performed will be referred to as "normal mode") (see FIG. 4), the second control signal S1U goes "L", causing the second bit line pair BL1, BL1X to be disconnected from the sense amplifier 10. Then, the word line WL0 is selected, causing the transistor Qe of the target cell to turn ON, so that a signal representing data of the target cell is outputted to the first bit line pair BL0, BL0X (see FIG. 4). In the test of this preferred embodiment, the test control signal ZWLF changes from "H" to "L" (FIG. 7D) before the transistor Qe of the target cell turns ON with the word line WL0 selected in order to read out data from the target cell.

Figure 8:
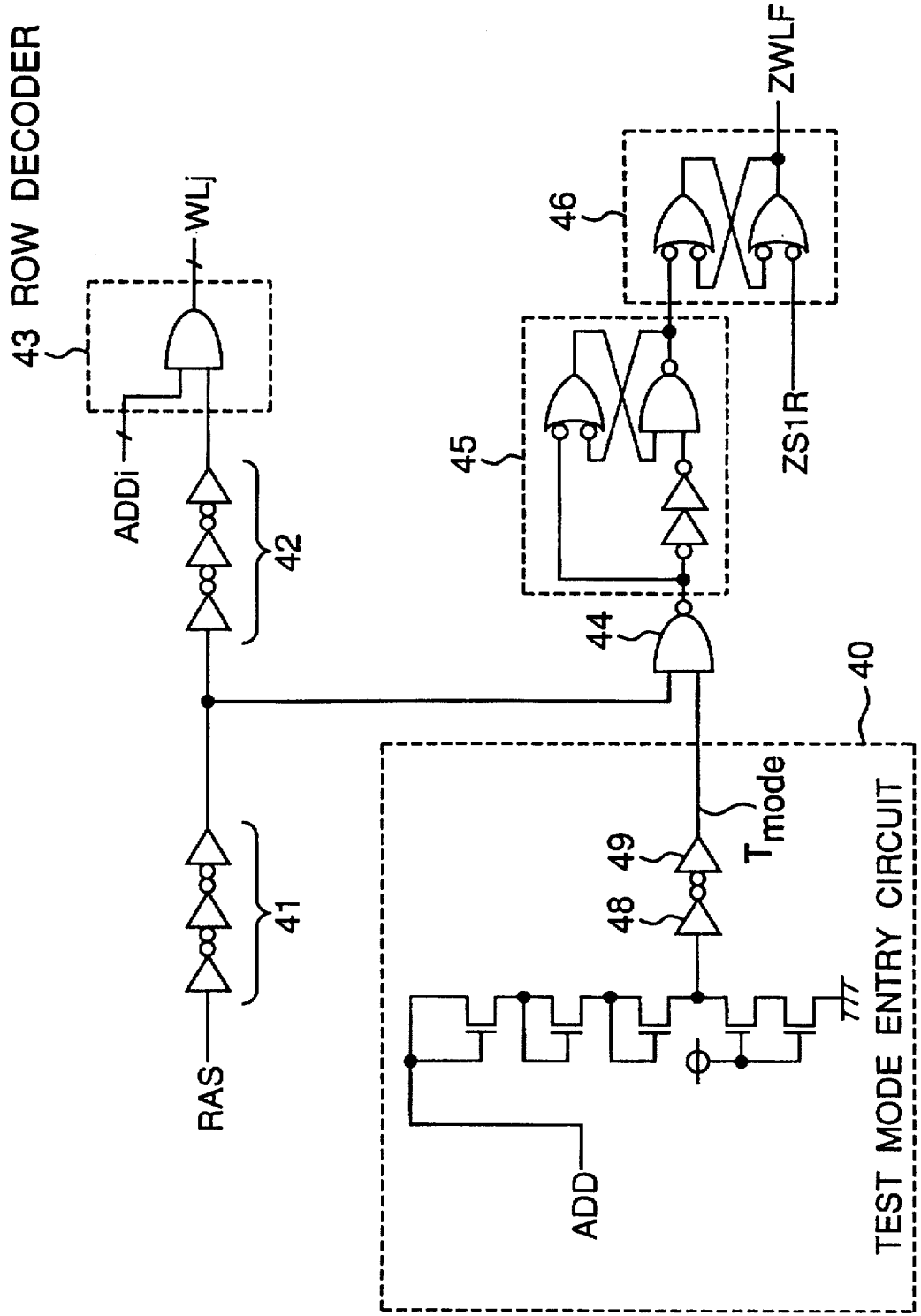
FIG. 8 is a circuit diagram showing the construction of a circuit that generates a test control signal ZWLF in Preferred Embodiment 1.

Such a test control signal ZWLF can be generated by a circuit as shown in FIG. 8. This circuit comprises: a test mode entry circuit 40 which incorporates N-channel MOS transistors and inverters; an inverter group 42 as a delay element; a row decoder 43; a NAND gate 44; a monostable circuit 45 which incorporates NAND gates and inverters; and an SR flip-flop 46 which incorporates NAND gates (depicted in the figure as an OR gate with the input inverted); and the like.

The test mode entry circuit 40 is a circuit for entering a signal Tmode representing whether or not the test mode is on (hereinafter, this signal will be referred to as "test mode signal", which is assumed to be "H" in the test mode). In this preferred embodiment, one of address terminals is used for the entry of the test mode signal Tmode, and when the test is performed, a signal ADD of a voltage (e.g., 9 V) higher than power supply voltage Vcc (e.g., 5 V) is applied to the address terminal. This signal is inputted to an inverter 48 as an "H" signal via three N-channel MOS transistors of diode connection (because the voltage of the signal ADD is Vcc at maximum in the normal mode, even an input of "H" to the address terminal will be regarded as "L" at the time point when inputted to the inverter 48 via the three N-channel transistors). The signal inputted to the inverter 48 is further inputted to the NAND gate 44 as the test mode signal Tmode via an inverter 49.

In addition to the test mode signal Tmode, a row address strobe signal RAS is inputted to the NAND gate 44 via an inverter group 41. An output signal of the NAND gate 44 is inputted to the monostable circuit 45, which in turn outputs a one-shot pulse when the row address strobe signal RAS has changed from "L" to "H" in the test mode.

An output signal of the monostable circuit 45 is inputted to the SR flip-flop 46, and when the one-shot pulse is inputted to the SR flip-flop 46, the test control signal ZWLF, which is an output signal of the SR flip-flop 46, changes from "H" to "L". Further, a bit line select reset signal ZS1R is also inputted to the SR flip-flop 46, and when this signal goes "L", the test control signal ZWLF changes from "L" to "H".

Meanwhile, the row address strobe signal RAS that has passed through the inverter group 41 further passes through the inverter group 42, being then inputted to the row decoder 43, while address signals ADDi (i=0, 1, . . . ) are also inputted thereto, where as decoding results, word line signals WLj (j=0, 1, . . . ) (word lines and word line signals will be designated by like reference characters and numerals, which is applicable hereinafter) are outputted from the row decoder 43.

In this way, by the insertion of the inverter group 42 into the signal path that serves to generate a word line signal, the delay time is adjusted. As a result, as shown in FIG. 7, the test control signal ZWLF will change from "H" to "L" before the transistor Qe of the target cell turns ON with the word line WL0 selected.

When the test control signal ZWLF generated in this way goes "L", the second control signal S1U goes to Vpp level as understood from the construction of the connection control signal generation circuit 30 as shown in FIG. 6 (FIG. 7E). As a result, the second bit line pair BL1, BL1X are connected to the sense amplifier 10. That is, before the transistor Qe of the target cell turns ON in the read operation, the first and second bit line pairs BL0, BL0X, BL1, BL1X come to be both connected to the sense amplifier 10, with the result that the capacitance of bit lines, as viewed from the sense amplifier 10, becomes twice that of the read operation in the normal mode. Therefore, with a deficiency of the cell capacitance margin, the amount of input signals to the sense amplifier 10 would be so small that a data signal obtained after the sense operation would result in a data signal different from the data that has been held in the target cell, in which case data could not be read correctly. For example, even if "L" data has previously been written in the target cell, "H" data would be read from the target cell by the aforementioned test. This means that faults due to cell capacitance margin deficiency can be detected from outside of the DRAM chip.

As shown above, according to this preferred embodiment, DRAM chips with a cell capacitance margin deficiency can be detected as defective by a simple test, so that faulty chips can be easily prevented from being sent to customers.

Preferred Embodiment 2

FIG. 9 is a diagram showing the construction of a connection control signal generation circuit 30 in a DRAM which is Preferred Embodiment 2 of the present invention. In this preferred embodiment, a test control signal ZS0NF (corresponding to the test control signal ZZ as described above) is added as an input to the connection control signal generation circuit 30, which makes it possible to perform a test for detecting faults due to sense margin deficiency (deficiency of sensitivity of the sense amplifier).

FIG. 10 is a signal waveform diagram showing operation of the test in this preferred embodiment. In this test operation also, data that has been held in a specified cell (a target cell comprising a transistor Qe and a capacitor cm) is read. The test operation in this preferred embodiment is described below with reference to FIGS. 9 and 10 as well as FIG. 1.

In the process of reading data from the target cell in the normal mode, as described before, the second control signal S1U goes "L", causing the second bit line pair BL1, BL1X to be disconnected from the sense amplifier 10. Then, the word line WL0 is selected, causing the transistor Qe of the target cell to turn ON. After that, the sense amplifier activating signals S0N, S0PX go active (with S0N at "H", S0PX at "L" ), whereby the sense operation of the sense amplifier is started (see FIG. 4). In the test of this preferred embodiment, the test control signal ZS0NF changes from "H" "H" to "L" (FIG. 10D) immediately after the transistors Qf, Qg have turned ON with the sense amplifier activating signals S0N, S0PX active (FIGS. 10G, 10H).

Figure 11:
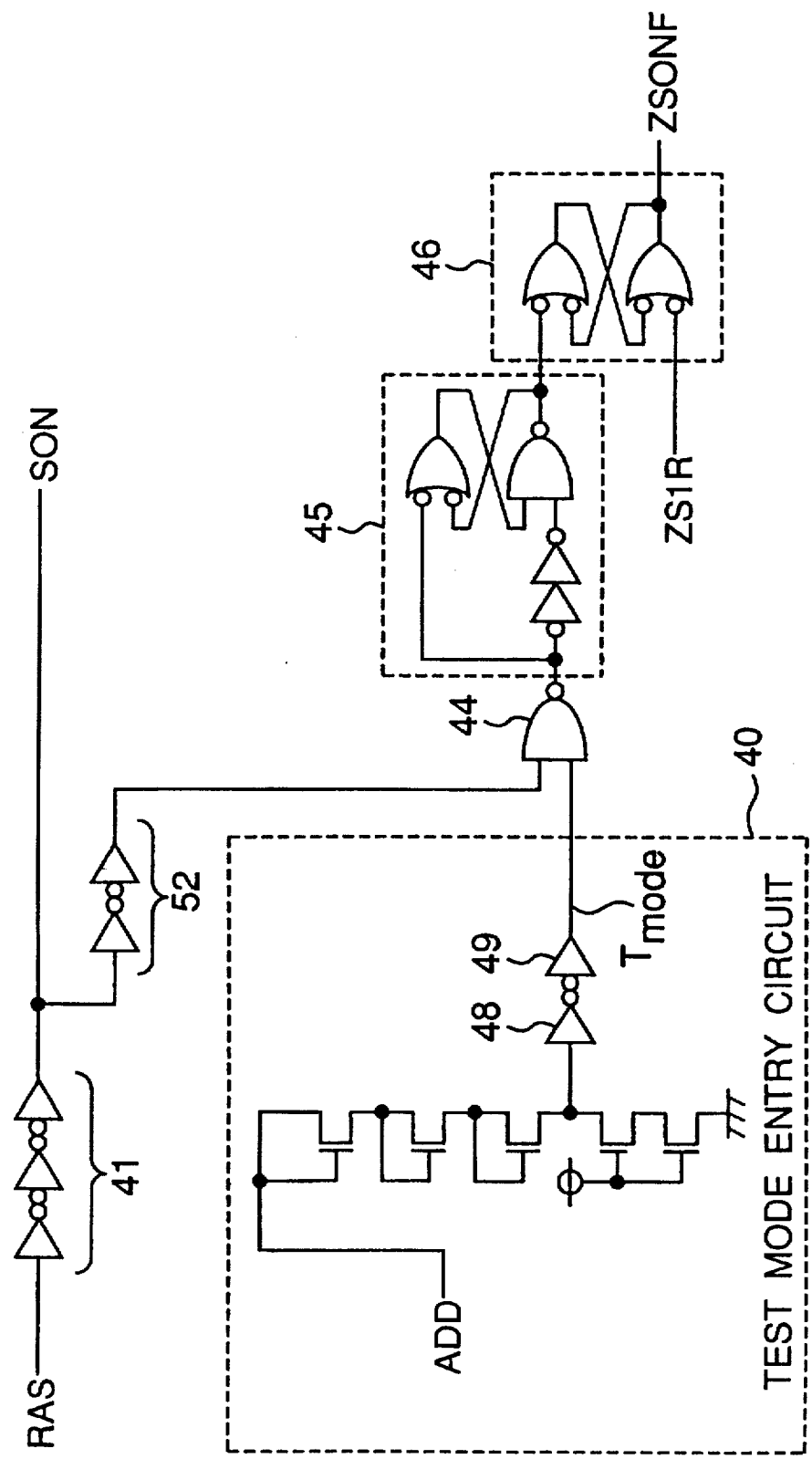
FIG. 11 is a circuit diagram showing the construction of a circuit that generates a test control signal ZS0NF in Preferred Embodiment 2.

Such a test control signal ZS0NF can be generated by a circuit as shown in FIG. 11. Out of this circuit, the same components as in the circuit shown in FIG. 8 (a circuit for generating the test control signal ZWLF) are designated by like reference numerals and their description is omitted. In the circuit as shown in FIG. 11, the signal which results after the row address strobe signal RAS has passed through the inverter group 41 is assumed as the sense amplifier activating signal S0N, and this signal S0N, after having passed through two inverters 52, is inputted to the NAND gate 44. With such a construction, the two inverters 52 serve as delay elements for timing adjustment, so that the test control signal ZS0NF will change from "H" to "L" immediately after the sense amplifier activating signal S0N has become active.

When the test control signal ZS0NF goes "L", the second control signal S1U goes to Vpp level as understood from the construction of the connection control signal generation circuit 30 as shown in FIG. 9 (Fig. 10E). As a result, the second bit line pair BL1, BL1X are connected to the sense amplifier 10. That is, immediately after the sense operation for the data signal that has been read from the target cell in the read operation is started, the second bit line pair BL1, BL1X come to be connected to the sense amplifier 10. As a result of this connection, noise is generated to the intra-amplifier bit line pair BL, BLX (Fig. 10F). Therefore, with a sense margin deficiency, data represented by a signal obtained after the sense operation would result in data different from the data that has been held in the target cell because of the noise, in which case data could not be read correctly. This means that faults due to sense margin deficiency can be detected from outside of the DRAM chip.

As shown above, according to this preferred embodiment, DRAM chips with a sense margin deficiency can be detected as defective by a simple test, so that faulty chips can be easily prevented from being sent to customers.

Preferred Embodiment 3

Figure 12:
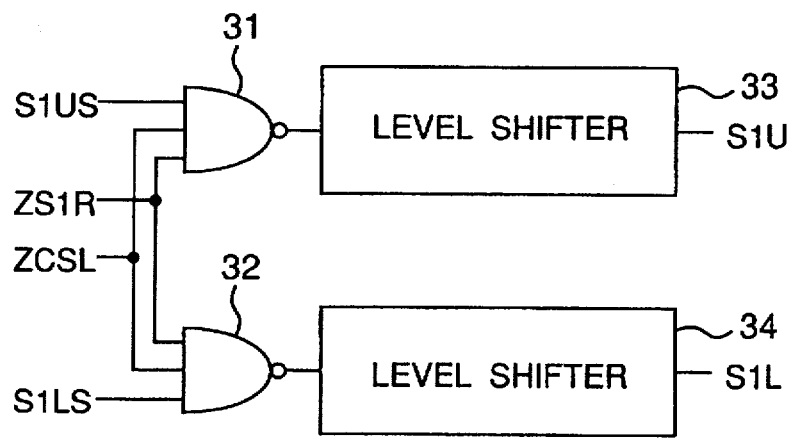
FIG. 12 is a circuit diagram showing the construction of a connection control signal generation circuit in Preferred Embodiment 3.

FIG. 12 is a diagram showing the construction of a connection control signal generation circuit 30 in a DRAM which is Preferred Embodiment 3 of the present invention. In this preferred embodiment, a test control signal ZCSL (corresponding to the test control signal ZZ as described above) is added as an input to the connection control signal generation circuit 30, which makes it possible to perform a test for detecting faults due to local I/O sense margin deficiency.

FIG. 13 is a signal waveform diagram showing operation of the test in this preferred embodiment. In this test operation also, data that has been held in a specified cell (a target cell comprising a transistor Qe and a capacitor Cm) is read. The test operation in this preferred embodiment is described below with reference to FIGS. 12 and 13 as well as FIG. 1.

In the process of reading data from the target cell in the normal mode, the second control signal S1U goes "L", causing the second bit line pair BL1, BL1X to be disconnected from the sense amplifier 10. Then, the word line WL0 is selected, causing the transistor Qe of the target cell to turn ON. After that, the sense amplifier activating signals S0N, S0PX go active, so that the sense operation is executed. In order to transmit a data signal obtained by this sense operation to another section (intermediate buffer) within the DRAM, the I/O connection signal CSL goes "H", causing the transistors Qi, Qh to turn ON, so that the intra-amplifier bit line pair BL, BLX are connected to the local I/O line pair LIO, LIOX (see FIG. 4). In the test of this preferred embodiment, the test control signal ZCSL changes from "H" to "L" (FIG. 13D) immediately after the transistors Qi, Qh have turned ON with the I/O connection signal CSL at "H".

Figure 14:
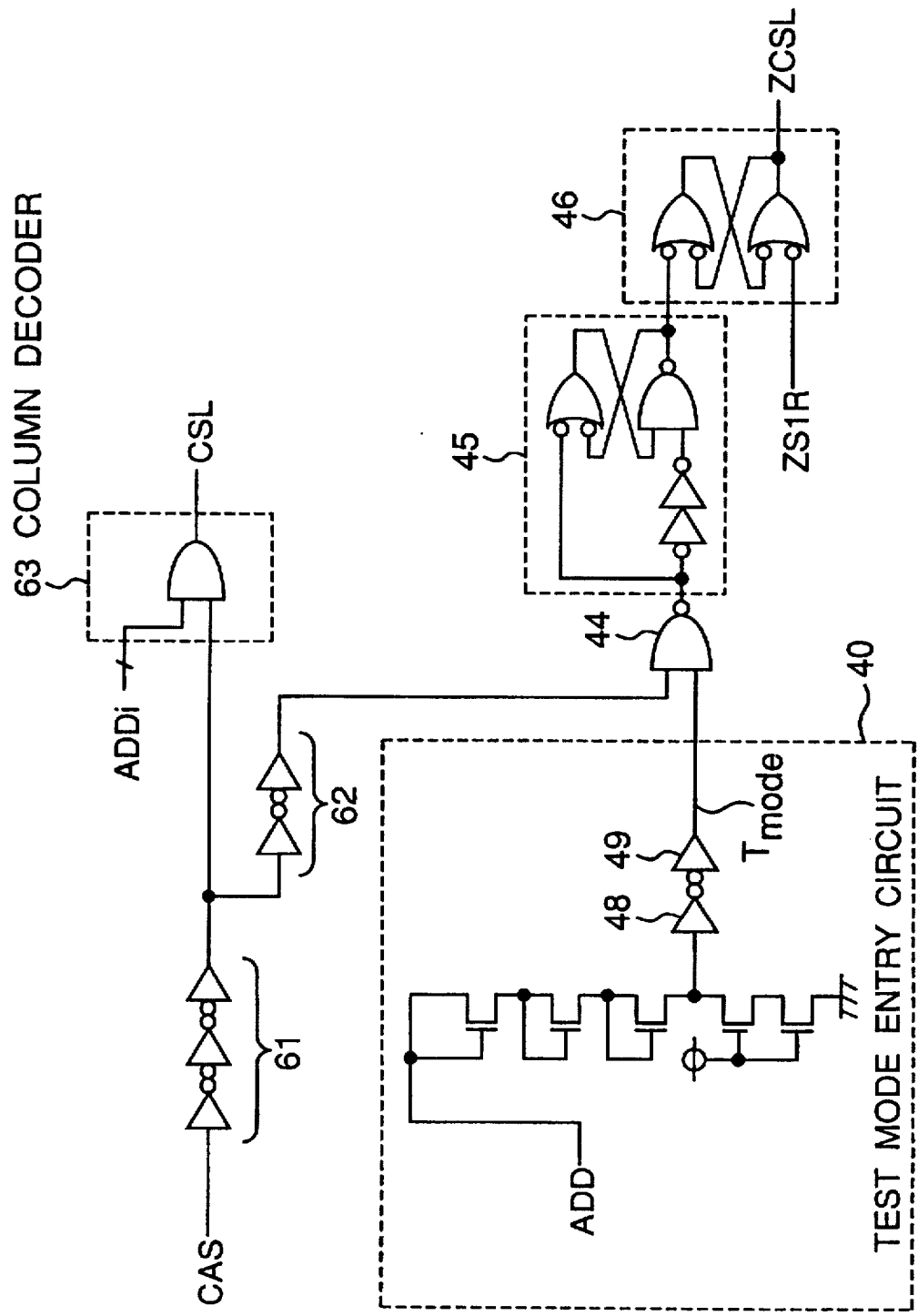
FIG. 14 is a circuit diagram showing the construction of a circuit that generates a test control signal ZCSL in Preferred Embodiment 3.

Such a test control signal ZCSL can be generated by a circuit as shown in FIG. 14. In this circuit, the same components as in the circuit shown in FIG. 8 (a circuit for generating the test control signal ZWLF) are designated by like reference numerals and their description is omitted. In the circuit as shown in FIG. 14, a column address strobe signal CAS, after having passed through an inverter group 61, is inputted to a column decoder 63. The column decoder 63 receives input of address signals ADDi (i=0, 1, . . . ) and yields output of the I/O connection signal CSL as its decoding results. Also, the column address strobe signal CAS that has passed through the inverter group 61 further passes through two inverters 62, being then inputted to the NAND gate 44. With such a construction, the two inverters 62 serve as delay elements for timing adjustment, so that the test control signal ZCSL will change from "H" to "L" immediately after the transistors Qi, Qh have turned ON with the I/O connection signal CSL at "H".

When the test control signal ZCSL goes "L", the second control signal S1U goes to Vpp level as understood from the construction of the connection control signal generation circuit 30 as shown in FIG. 12 (FIG. 13E). As a result, the second bit line pair BL1, BL1X are connected to the sense amplifier 10. That is, immediately after the sense operation for the data signal that has been read from the target cell in the read operation is executed and the intra-amplifier bit line pair BL, BLX are connected to the local I/O line pair LIO, LIOX, the second bit line pair BL1, BL1X come to be connected to the sense amplifier 10. As a result of this connection, noise is generated to the intra-amplifier bit line pair BL, BLX and the local I/O line pair LIO, LIOX (FIGS. 13F, 13G). Therefore, with a local I/O sense margin deficiency (deficiency of sensitivity of the sense operation due to the preamplifier of the intermediate buffer connected to the local I/O line), data transferred by the local I/O lines LIO, LIOX would result in data different from the data that has been held in the target cell because of the noise, in which case data could not be read correctly. This means that faults due to local I/O sense margin deficiency can be detected from outside of the DRAM chip.

As shown above, according to this preferred embodiment, DRAM chips with a local I/O sense margin deficiency can be detected as faulty by a simple test, so that faulty chips can be easily prevented from being shipped to customers.

Preferred Embodiment 4

Figure 15:
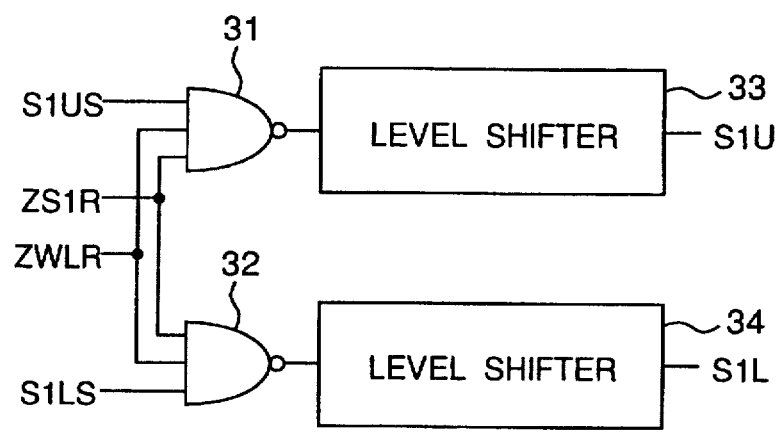
FIG. 15 is a circuit diagram showing the construction of a connection control signal generation circuit in Preferred Embodiment 4.

FIG. 15 is a diagram showing the construction of a connection control signal generation circuit 30 in a DRAM which is Preferred Embodiment 4 of the present invention. In this preferred embodiment, a test control signal ZWLR (corresponding to the test control signal ZZ as shown in FIG. 2) is added as an input to the connection control signal generation circuit 30, which makes it possible to perform a test for detecting faults due to write margin deficiency.

FIG. 16 is a signal waveform diagram showing operation of the test in this preferred embodiment. In this test operation, data is written into a specified cell (a target cell comprising a transistor Qe and a capacitor Cm). The test operation in this preferred embodiment is described below with reference to FIGS. 15 and 16 as well as FIG. 1.

In the process of writing data into the target cell in the normal mode, the second control signal S1U goes "L", causing the second bit line pair BL1, BL1X to be disconnected from the sense amplifier 10. Then, the word line WL0 is selected, causing the transistor Qe of the target cell to turn ON, where data transferred along the local I/O lines LIO, LIOX are written into the target cell. After that, the word line WL0 goes "L" (non-selected) so that the transistor Qe of the target cell turns OFF (see FIG. 5). In the test of this preferred embodiment, the test control signal ZWLR changes from "H" to "L" (FIG. 16D) immediately before the transistor Qe turns OFF with the word line WL0 at "L".

Figure 17:
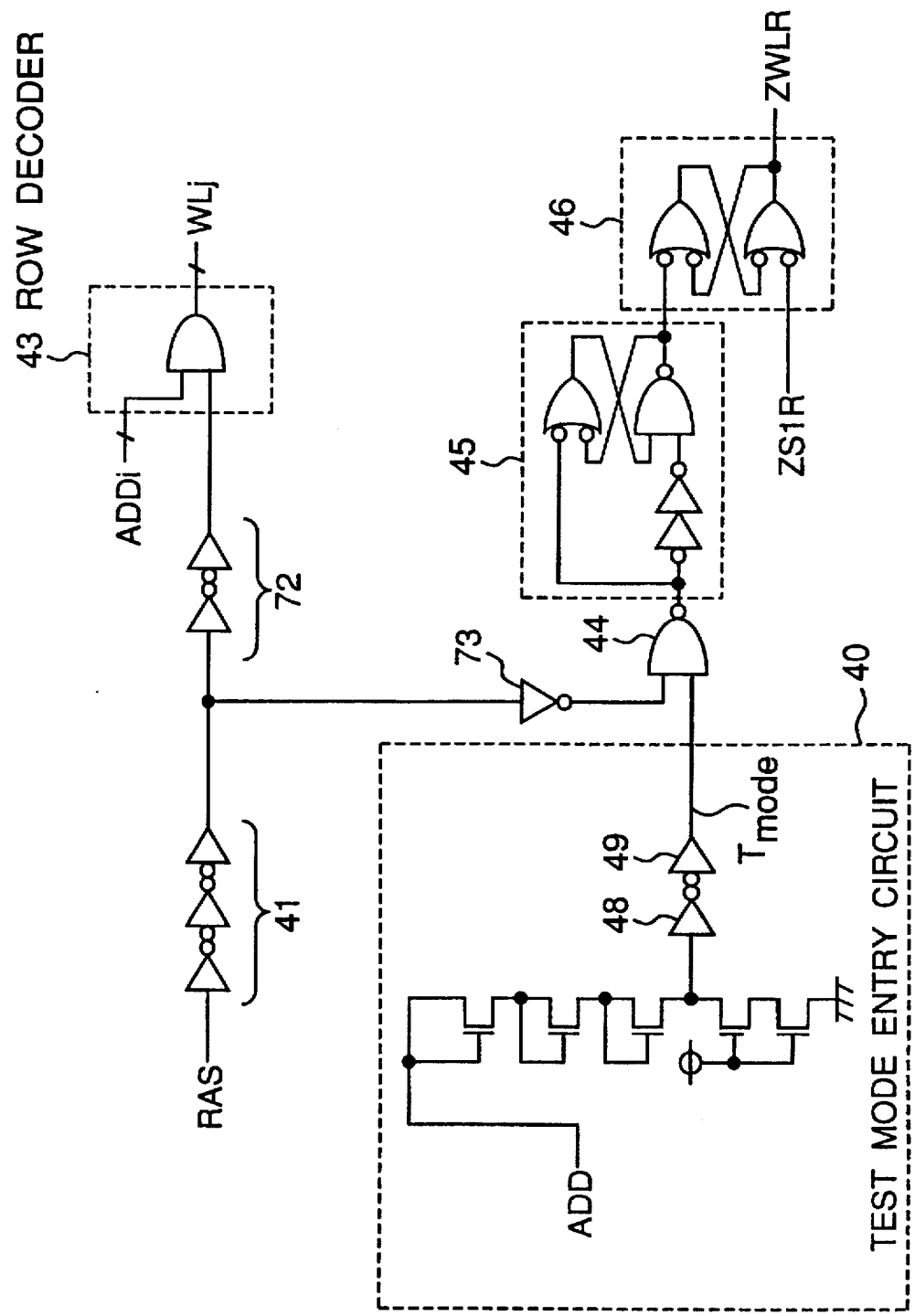
FIG. 17 is a circuit diagram showing the construction of a circuit that generates a test control signal ZWLR in Preferred Embodiment 4.

Such a test control signal ZWLR can be generated by a circuit as shown in FIG. 17. In this circuit, the same components as in the circuit shown in FIG. 8 (a circuit for generating the test control signal ZWLF) are designated by like reference numerals and their description is omitted. The circuit of FIG. 8 and the circuit of FIG. 17 are similar to each other in that the row address strobe signal RAS, after passing through the inverter group 41, further passes through the inverter group 42 or 72 and is then inputted to the row decoder 43. However, the circuit of FIG. 17 differs from the circuit of FIG. 8 in that the inverter group 72 serving as a delay element comprises two inverters, and that the row address strobe signal RAS that has passed through the inverter group 41 is inputted to the NAND gate 44 after having been inverted by an inverter 73. With such differences in construction, the test control signal ZWLR generated by the circuit of FIG. 17 will change from "H" to "L" immediately before the transistor Qe of the target cell turns OFF with the word line WL0 at "L".

When the test control signal ZWLR goes "L", the second control signal siU goes to Vpp level as understood from the construction of the connection control signal generation circuit 30 as shown in FIG. 15 (FIG. 16E). As a result, the second bit line pair BL1, BL1X are connected to the sense amplifier 10. That is, after data has been written into the target cell and immediately before the target cell goes into a non-selected state (the transistor Qe turns OFF), the second bit line pair BL1, BL1X come to be connected to the sense amplifier 10. As a result of this connection, noise is generated to the intra-amplifier bit line pair BL, BLX and the first bit line pair (the bit line pair to which the target cell has been connected) BL0, BL0X (FIG. 16F). Therefore, with a write margin deficiency (when data of greater than normal amount of signals is needed to correctly write data into the cell), data to be held in the target cell after the write operation would result in different data from the data that has been transferred by the local I/O lines LIO, LIOX because of the noise, in which case data could not be written correctly. This means that faults due to write margin deficiency can be detected from outside of the DRAM chip by reading the data that has been written into the target cell by the test.

As shown above, according to this preferred embodiment, DRAM chips with a write margin deficiency can be detected as defectives by a simple test, so that faulty chips can be easily prevented from being shipped to customers.

Preferred Embodiment 5

Figure 18:
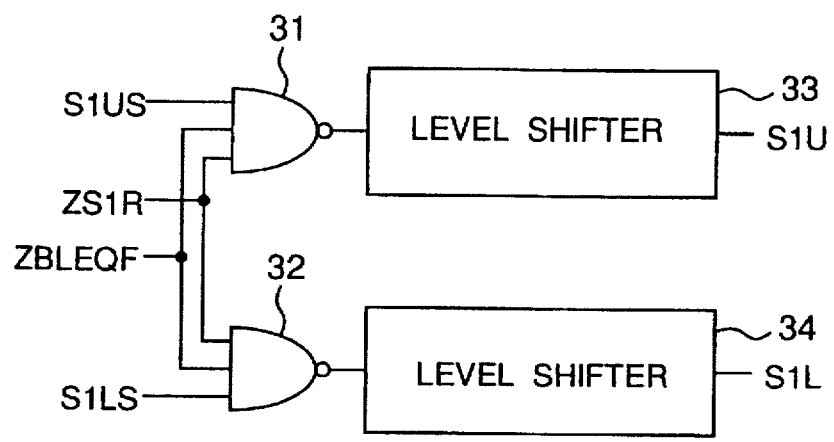
FIG. 18 is a circuit diagram showing the construction of a connection control signal generation circuit in Preferred Embodiment 5.

FIG. 18 is a diagram showing the construction of a connection control signal generation circuit 30 in a DRAM which is Preferred Embodiment 5 of the present invention. In this preferred embodiment, a test control signal ZBLEQF (corresponding to the test control signal ZZ as described above) is added as an input to the connection control signal generation circuit 30, which makes it possible to perform a test for detecting faults due to equalize margin deficiency (a deficiency of in the ability to precharge the bit line pair to Vcc/2 ).

FIG. 19 is a signal waveform diagram showing operation of the test in this preferred embodiment. In this test operation, data read operation from a cell is continuously executed. The test operation in this preferred embodiment is described below with reference to FIGS. 18 and 19 as well as FIG. 1.

When data read operation is continuously executed in the normal mode, assuming that data is first read from a cell comprising a transistor Qe and a capacitor Cm, then the second control signal S1U goes "L", causing the second bit line pair BL1, BL1X to be disconnected from the sense amplifier 10. Then, the word line WL0 is selected and data is read from the cell, and thereafter the word line WL0 goes into a non-selected state. After that, during the period while the word line WL0 keeps non-selected, the sense amplifier activating signals S0N, S0PX go inactive so that the operation of the sense amplifier 10 is halted, and then the second control signal S1U goes "H", causing the second bit line pair BL1, BL1X to be connected to the sense amplifier 10, and the bit line equalize signal BLEQ goes "H" so that the bit line pairs BL, BLX, BL0, BL0X, BL1, BL1X are precharged to Vcc/2 (see FIG. 4). However, the second bit line pair BL1, BL1X, which are different from the bit line pair connected to the cell of the reading target, have come to Vcc/2 level at the preceding precharge, which level is maintained until the present precharge.

In contrast to this, in the test of this preferred embodiment, after the reading of data from the cell and the execution of the sense operation by the sense amplifier 10, and a specified period before the operation of the sense amplifier 10 is halted with the sense amplifier activating signals S0N, S0PX inactive while the word line WL0 holds non-selected, the test control signal ZBLEQF changes from "H" to "L" (FIG. 19D).

Figure 20:
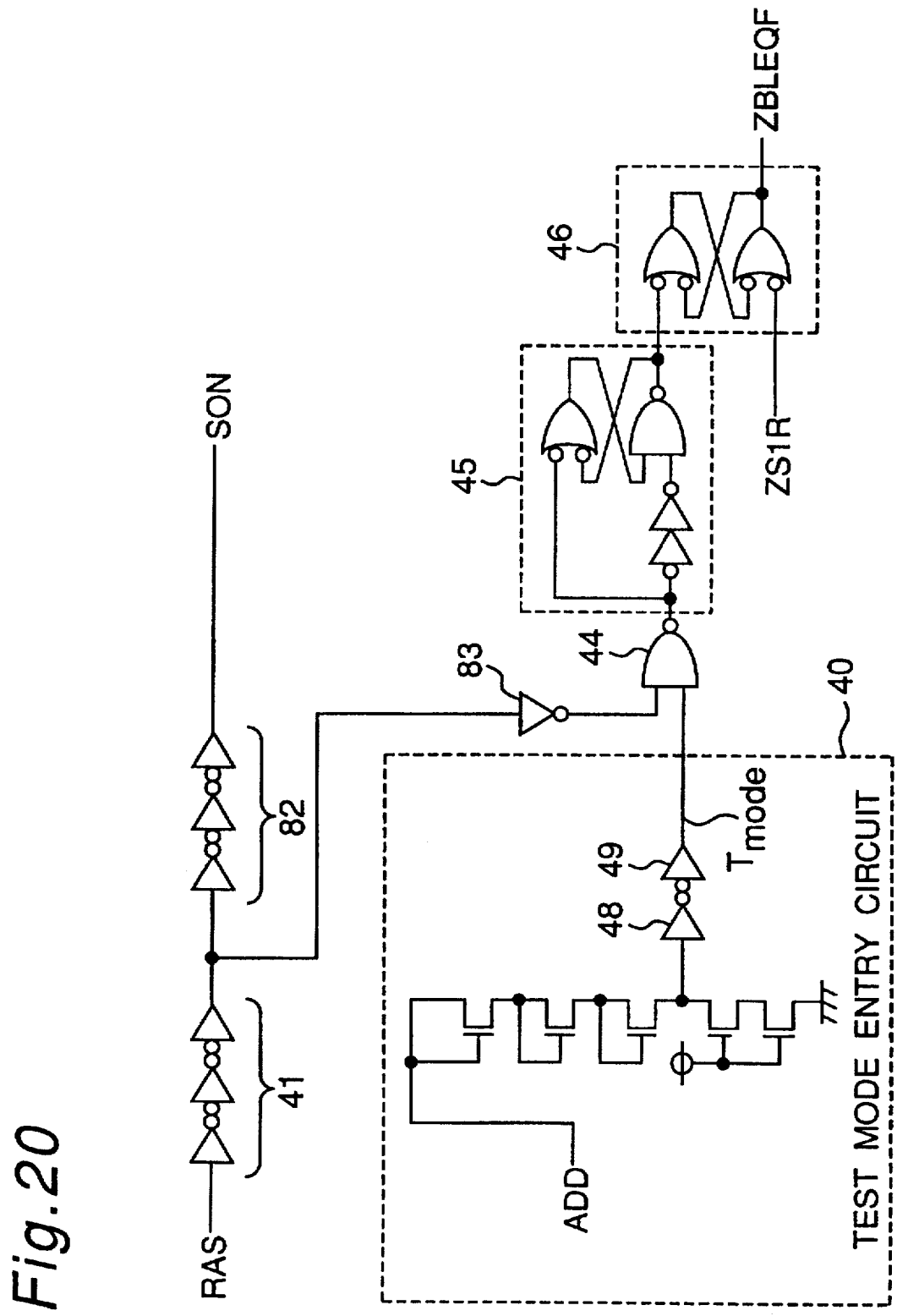
FIG. 20 is a circuit diagram showing the construction of a circuit that generates a test control signal ZBLEQF in Preferred Embodiment 5.

Such a test control signal ZBLEQF can be generated by a circuit as shown in FIG. 20. Out of this circuit, the same components as in the circuit shown in FIG. 8 (a circuit for generating the test control signal ZWLF) are designated by like reference numerals and their description is omitted. In the circuit as shown in FIG. 20, the signal which results after the row address strobe signal RAS has passed through the inverter groups 41 and 82 is assumed as the sense amplifier activating signal S0N, and a signal after having passed through the inverter group 41 is inputted to the NAND gate 44 after having been inverted by an inverter 83. With such a construction, the four inverters 82 serve as delay elements for timing adjustment, while the input signal to the NAND gate 44 is inverted by the inverter 83. As a result, the test control signal ZS0NF will change from "H" to "L" a specified period before the sense amplifier activating signal S0N goes inactive.

When the test control signal ZBLEQF goes "L", the second control signal S1U goes to Vpp level as understood from the construction of the connection control signal generation circuit 30 as shown in FIG. 18 (FIG. 19D). As a result, the second bit line pair BL1, BL1X are connected to the sense amplifier 10, so that the capacitance of bit lines, as viewed from the sense amplifier 10, is doubled. A specified period after the time point of this connection, the word line WL0 goes into a non-selected state, where this specified period is set to such a period that the second bit line pair BL1, BL1X can be sufficiently charged to "H" or "L" (such a setting of the specified period can be achieved by adjusting the number of inverters constituting the inverter group 82 or the like). Therefore, after the word line WL0 has come to the non-selected state and immediately before the precharging to Vcc/2 is started with the bit line equalize signal BLEQ at "H", the bit line pairs BL, BLX, BL0, BL0X, BL1, BL1X have been fully charged to either "H" or "L". For example, if "L" data has been read from the cell, the bit line pairs BL, BL0, BL1 have been charged to "L" and the bit line pairs BLX, BL0X, BL1X have been charged to "H" by this time point. Accordingly, in order to precharge these bit line pairs to Vcc/2, a charging ability (precharging ability) greater than necessary in the normal mode would be required. For this reason, with an equalize margin deficiency (a deficiency of the ability of an equalizer circuit), a long time would be required to precharge the bit line pairs to Vcc/2, such that data could not be read out correctly in the succeeding reading cycle (a cycle in which the word line WL1 is selected in FIG. 19). For example, even with "H" data held in the cell that becomes the reading target in the succeeding cycle, if "L" data has been held in the cell that has been the reading target in the present cycle, then a deficiency of equalize margin would result in an event that "L" data would be read out in the succeeding cycle. This means that faults due to equalize margin deficiency can be detected from outside of the DRAM chip by successively reading data by the test.

As shown above, according to this preferred embodiment, DRAM chips with a equalize margin deficiency can be detected as defective by a simple test, so that faulty chips can be easily prevented from being shipped to customers.

The entire disclosure of Japanese Patent Application No. 9-115598 filed on May 6, 1997 including specification, claims, drawings and summary are incorporated herein by reference in its entirety.

What is claimed is:

1. A semiconductor memory device by a shared sense amplifier system, comprising:

a sense amplifier;

a plurality of bit line pairs;

a plurality of word lines;

a plurality of dynamic RAM cells each connected with one of the bit line pairs and one of the word lines which is selected when data is read or written;

switch means disposed on each bit line pair for connecting the corresponding bit line pair with said sense amplifier when said switch means is turned on and for disconnecting the corresponding bit line pair from said sense amplifier when said switch means is turned off; and bit line connection control means for turning on said switch means on the bit line pairs other than the bit line pair connected with one of the RAM cells which is connected with the word line to be selected, after said switch means on the bit line pair connected with such one of the RAM cells has been turned on, but before the word line connected with such one of the RAM cells is selected, wherein said switch means on the bit line pairs other than the bit line pair connected with such one of the RAM cells is turned on by said bit line connection control means when data is to be read from such one of the RAM cells during a test to be conducted for detecting faults resulting from margin deficiency.

2. The semiconductor memory device of claim 1, wherein each of said switch means is a pair of MOS transistors, one of a source and a drain of each of the pair of MOS transistors is connected with said sense amplifier and the other of the source and the drain is connected with one of the plural dynamic RAM cells, and wherein said bit line connection control means includes signal generation means for generating a control signal which is applied to a gate of each of the MOS transistors to control turn-ON and turn-OFF of the MOS transistors in the test.

3. A semiconductor memory device by a shared sense amplifier system, comprising:

a sense amplifier;

a plurality of bit line pairs;

a plurality of word lines;

a plurality of dynamic RAM cells each connected with one of the bit line pairs and one of the word lines which is selected when data is read or written;

switch means disposed on each bit line pair for connecting the corresponding bit line pair with said sense amplifier when said switch means is turned on and for disconnecting the corresponding bit line pair from said sense amplifier when said switch means is turned off;

a local I/O line for transferring to an independently provided intermediate buffer a signal obtained through operation of said sense amplifier on a signal of data read from one of the RAM cells;

I/O line connection control means for controlling connection between said local I/O line and said sense amplifier; and bit line connection control means for turning on said switch means on the bit line pairs other than the bit line pair connected with one of the RAM cells which is connected with the word line to be selected, after said switch means on the bit line pair connected with such one of the RAM cells has been turned on, and immediately after said local I/O line has been connected with said sense amplifier by said I/O line connection control means, wherein said switch means on the bit line pairs other than the bit line pair connected with such one of the RAM cells is turned on by said bit line connection control means when data is to be read from such one of the RAM cells during a test to be conducted for detecting faults resulting from margin deficiency.

4. The semiconductor memory device of claim 3, wherein each of said switch means is a pair of MOS transistors, one of a source and a drain of each of the pair of MOS transistors is connected with said sense amplifier and the other of the source and the drain is connected with one of the plural dynamic RAM cells, and wherein said bit line connection control means includes signal generation means for generating a control signal which is applied to a gate of each of the MOS transistors to control turn-ON and turn-OFF of the MOS transistors in the test.

5. A semiconductor memory device by a shared sense amplifier system, comprising:

a sense amplifier;

a plurality of bit line pairs;

a plurality of word lines;

a plurality of dynamic RAM cells each connected with one of the bit line pairs and one of the word lines which is selected when data is read or written;

switch means disposed on each bit line pair for connecting the corresponding bit line pair with said sense amplifier when said switch means is turned on and for disconnecting the corresponding bit line pair from said sense amplifier when said switch means is turned off; and bit line connection control means for turning on said switch means on the bit line pairs other than the bit line pair connected with one of the RAM cells which is connected with the word line to be selected, after said switch means on the bit line pair connected with such one of the RAM cells has been turned on, and after the word line connected with such one of the RAM cells has been kept selected for a predetermined period, but immediately before the word line goes to a non-selected state, wherein said switch means on the bit line pairs other than the bit line pair connected with such one of the RAM cells is turned on by said bit line connection control means when data is to be written into such one of the RAM cells during a test to be conducted for detecting faults resulting from margin deficiency.

6. The semiconductor memory device of claim 5, wherein each of said switch means is a pair of MOS transistors, one of a source and a drain of each of the pair of MOS transistors is connected with said sense amplifier and the other of the source and the drain is connected with one of the plural dynamic RAM cells, and wherein said bit line connection control means includes signal generation means for generating a control signal which is applied to a gate of each of the MOS transistors to control turn-ON and turn-OFF of the MOS transistors in the test.

* * * * *